United States Patent
Kim

(10) Patent No.: US 10,347,789 B2
(45) Date of Patent: Jul. 9, 2019

(54) LIGHT EMITTING DEVICE AND LIGHT EMITTING DEVICE PACKAGE HAVING SAME

(71) Applicant: LG INNOTEK CO., LTD., Seoul (KR)

(72) Inventor: Chong Cook Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 73 days.

(21) Appl. No.: 15/538,435

(22) PCT Filed: Nov. 11, 2015

(86) PCT No.: PCT/KR2015/012138
§ 371 (c)(1),
(2) Date: Jun. 21, 2017

(87) PCT Pub. No.: WO2016/104946
PCT Pub. Date: Jun. 30, 2016

(65) Prior Publication Data
US 2017/0358705 A1 Dec. 14, 2017

(30) Foreign Application Priority Data

Dec. 22, 2014 (KR) ........................ 10-2014-0185904

(51) Int. Cl.
*H01L 33/06* (2010.01)
*H01L 33/14* (2010.01)
(Continued)

(52) U.S. Cl.
CPC .............. *H01L 33/06* (2013.01); *H01L 33/14* (2013.01); *H01L 33/08* (2013.01); *H01L 33/32* (2013.01)

(58) Field of Classification Search
CPC ......... H01L 33/14; H01L 33/06; H01L 33/08; H01L 33/32
See application file for complete search history.

(56) References Cited

U.S. PATENT DOCUMENTS

| 2004/0131098 A1 | 7/2004 | Garbuzov et al. |
| 2011/0188528 A1 | 8/2011 | Kisin et al. |
| 2015/0162493 A1 | 6/2015 | Ahn |

FOREIGN PATENT DOCUMENTS

| KR | 10-2013-0018072 A | 2/2013 |
| KR | 10-2013-0067821 A | 6/2013 |

(Continued)

OTHER PUBLICATIONS

Espacenet translation of Korean Application Choi, App # 20130026534; Pub # 2014-0112177.*

(Continued)

*Primary Examiner* — Peniel M Gumedzoe
(74) *Attorney, Agent, or Firm* — Birch, Stewart, Kolasch & Birch, LLP

(57) ABSTRACT

A light emitting device includes a first conductivity type semiconductor layer including a first conductivity type dopant, an active layer disposed on the first conductivity type semiconductor layer and including a plurality of barrier layers and a plurality of well layers, an electron blocking structure layer disposed on the active layer, and a second conductivity type semiconductor layer disposed on the electron blocking structure layer. The active layer includes a first barrier layer adjacent to the electron blocking structure layer and a first well layer adjacent to the first barrier layer. The plurality of barrier layers include a first conductivity type dopant. The electron blocking structure layer includes a plurality of semiconductor layers including a second conductivity type dopant and AlGaN-based semiconductor. The plurality of semiconductor layers include a first semiconductor layer having a first region adjacent to the first barrier layer. The first region of the first semiconductor layer includes AlGaN-based semiconductor having aluminum composition of 95% or more. A light emitting structure (Continued)

including the active layer and the electron blocking structure layer emits different peak wavelengths.

20 Claims, 9 Drawing Sheets

(51) Int. Cl.
  *H01L 33/32* (2010.01)
  *H01L 33/08* (2010.01)

(56) References Cited

FOREIGN PATENT DOCUMENTS

| | | |
|---|---|---|
| KR | 10-2013-0111032 A | 10/2013 |
| KR | 10-2014-0003125 A | 1/2014 |
| KR | 10-2014-0075318 A | 6/2014 |
| KR | 10-2014-0112177 A | 9/2014 |
| KR | 10-2014-0123217 A | 10/2014 |

OTHER PUBLICATIONS

International Search Report, issued in PCT/KR2015/012138, dated Mar. 10, 2016.

* cited by examiner

LIGHT EMITTING DEVICE AND LIGHT EMITTING DEVICE PACKAGE HAVING SAME

CROSS REFERENCE TO RELATED APPLICATIONS

This application is the National Phase of PCT International Application No. PCT/KR2015/012138, filed on Nov. 11, 2015, which claims priority under 35 U.S.C. 119(a) to Patent Application No. 10-2014-0185904, filed in the Republic of Korea on Dec. 22, 2014, all of which are hereby expressly incorporated by reference into the present application.

TECHNICAL FIELD

An embodiment relates to a light emitting device.

An embodiment relates to an ultraviolet light emitting device.

An embodiment relates to a light emitting device package including a UV light emitting device.

BACKGROUND ART

In general, since a nitride semiconductor material including a group V source such as nitrogen (N) and a group III source such as gallium (Ga), aluminum (Al), or indium (In) has excellent thermal stability and a direct transition type energy band structure, the nitride semiconductor material is widely used for a material of a nitride-based semiconductor device, for example, a nitride-based semiconductor light emitting device in an ultraviolet (UV) light range, and a material of a photovoltaic cell.

Since the nitride-based material has a wide energy band gap of 0.7 eV to 6.2 eV, the nitride-based material is widely used as a material of a photovoltaic cell device due to characteristics consistent with those of a solar spectrum. In particular, the UV light emitting device is widely used in various industrial fields, such as light firearms, medical analyzers, therapeutic apparatuses, sterilization systems, water purification systems, and air purification systems and attracts attention as a material usable in general illumination as a future semiconductor illumination light source.

DISCLOSURE OF THE INVENTION

Technical Problem

Embodiments provide a light emitting device, which emits a dual peak wavelength, and a light emitting device package including the same.

Embodiments provide an ultraviolet (UV) light emitting device, which emits a dual peak wavelength, and a light emitting device package including the same.

Embodiments provide a light emitting device which emits a first peak wavelength generated from an active layer and a second peak wavelength having a shorter wavelength than the first peak wavelength due to a difference in a band gap between the active layer and an electron blocking layer.

Embodiments provide a light emitting device which emits different UV-C wavelengths.

Technical Solution

A light emitting device according to an embodiment includes: a first conductivity type semiconductor layer including a first conductivity type dopant; an active layer disposed on the first conductivity type semiconductor layer and including a plurality of barrier layers and a plurality of well layers; an electron blocking structure layer disposed on the active layer; and a second conductivity type semiconductor layer disposed on the electron blocking structure layer, wherein the active layer includes a first barrier layer adjacent to the electron blocking structure layer and a first well layer adjacent to the first barrier layer, the plurality of barrier layers include a first conductivity type dopant, the electron blocking structure layer includes a plurality of semiconductor layers including a second conductivity type dopant and AlGaN-based semiconductor, the plurality of semiconductor layers include a first semiconductor layer having a first region adjacent to the first barrier layer, the first region of the first semiconductor layer includes AlGaN-based semiconductor having aluminum composition of 95% or more, and a light emitting structure including the active layer and the electron blocking structure layer emits different peak wavelengths.

A light emitting device package according to an embodiment includes: a support member; a light emitting device disposed on the support member; and first and second electrode layers electrically connected to the light emitting device, wherein a light emitting structure of the light emitting device emits ultraviolet light having different first and second peak wavelengths.

Advantageous Effects of the Invention

According to embodiments, different ultraviolet (UV) wavelengths emitted from a single light emitting device are used for sterilization, thereby improving sterilization effect.

According to embodiments, since a single light emitting device emits a DNA absorption wavelength and a protein absorption wavelength, there is an effect that need not use different light emitting devices.

According to embodiments, it is possible to improve reliability of a sterilization UV light emitting device.

According to embodiments, a light emitting device package and a UV lamp, each including a UV light emitting device, can be provided.

MODE FOR CARRYING OUT THE INVENTION

In the description of embodiments, it will be understood that when a layer (or film), region, pattern or structure is referred to as being "on" another layer (or film), region, pad or pattern, the terminology of "on" and "under" includes both the meanings of "directly" and "indirectly". Further, the reference about "on" and "under" each layer will be made on the basis of drawings.

<Light Emitting Device>

Figure 1:
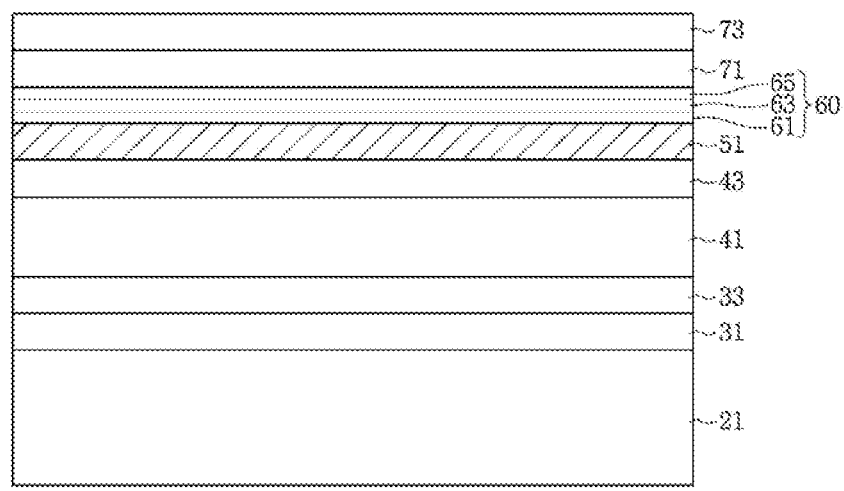
FIG. 1 is a view illustrating a light emitting device according to an embodiment.

FIG. 1 is a cross-sectional view of a light emitting device according to an embodiment.

Referring to FIG. 1, a light emitting device according to an embodiment may include a first conductivity type semiconductor layer 41, an active layer 51 disposed on the first conductivity type semiconductor layer 41, an electron blocking structure layer 60 disposed on the active layer 51, and a second conductivity type semiconductor layer 73 disposed on the electron blocking structure layer 60.

The light emitting device may include at least one or all of a low-conductivity layer 33, a buffer layer 31, and a substrate 21, which are disposed below the first conductivity type semiconductor layer 41.

The light emitting device may include at least one or all of a first clad layer 43 between the first conductivity type semiconductor layer 41 and the active layer 51 and a second clad layer 71 between the active layer 51 and the second conductivity type semiconductor layer 73.

The light emitting device emits light having different ultraviolet (UV) wavelengths. The light emitting device emits a wavelength of 290 nm or less, and the different UV wavelengths have a difference of 8 nm or more at a wavelength of 290 nm or less.

The substrate 21 may be, for example, a light-transmitting substrate, a conductive substrate, or an insulating substrate. For example, the substrate 21 may include at least one of sapphire ($Al_2O_3$), SiC, Si, GaAs, GaN, ZnO, GaP, InP, Ge, and $Ga_2O_3$. A plurality of protrusions (not shown) may be formed on an upper surface and/or a lower surface of the substrate 21. A side cross-section of each of the plurality of protrusions may have a hemispherical shape, a polygonal shape, and an oval shape. The plurality of protrusions may be arranged in a stripe form or a matrix form. The protrusions may improve light extraction efficiency.

A plurality of compound semiconductor layers may be grown on the substrate 21. A growth apparatus for growing the plurality of compound semiconductor layers may employ an electron beam evaporator, a physical vapor deposition (PVD) apparatus, a chemical vapor deposition (CVD) apparatus, a plasma laser deposition (PLD) apparatus, a dual-type thermal evaporator, a sputtering apparatus, a metal organic chemical vapor deposition (MOCVD) apparatus, or the like, but is not limited to these apparatuses.

The buffer layer 21 may be disposed between the substrate 21 and the first conductivity type semiconductor layer 41. The buffer layer 113 may be formed with at least one layer by using group II to VI compound semiconductors. The buffer layer 31 may include a semiconductor layer using a group III-V compound semiconductor and may be formed of, for example, a semiconductor material having an empirical formula of $In_xAl_yGa_{1-x-y}N$ (0≤x≤1, 0≤y≥1, 0≤x+y≤1).

The buffer layer 31 may include, for example, at least one of GaN, AlN, AlGaN, InGaN, InN, InAlGaN, AlInN, AlGaAs, GaP, GaAs, GaAsP, AlGaInP, and ZnO.

The buffer layer 31 may be formed to have a super lattice structure by alternately arranging different semiconductor layers. The buffer layer 31 may be formed so as to reduce a difference in lattice constant between the substrate 21 and a nitride-based semiconductor layer and may be defined as a defect control layer. The buffer layer 31 may have a value between lattice constants of the substrate 21 and the nitride-based semiconductor layer. The buffer layer 31 may not be formed, but the present invention is not limited thereto.

The low-conductivity layer 33 may be disposed between the buffer layer 31 and the first conductivity type semiconductor layer 41. The low-conductivity layer 33 is an undoped semiconductor layer and has a lower electrical conductivity than the first conductivity type semiconductor layer 41.

The low-conductivity layer 33 may be formed of group II to VI compound semiconductors, for example, a group III-V compound semiconductor. The undoped semiconductor layer has first conductivity type characteristics even though a conductive dopant is intentionally undoped. The undoped semiconductor layer may not be formed, but the present invention is not limited thereto. The low-conductivity layer 33 may include, for example, at least one of GaN, AlN, AlGaN, InGaN, InN, InAlGaN, AlInN, AlGaAs, GaP, GaAs, GaAsP, and AlGaInP. The low-conductivity layer 33 may not be formed, but the present invention is not limited thereto.

The first conductivity type semiconductor layer 41 may be disposed between the active layer 51 and at least one of the substrate 21, the buffer layer 31, and the low-conductivity layer 33. The first conductivity type semiconductor layer 41 may be formed of at least one of group III-V and II-VI compound semiconductors doped with a first conductivity type dopant.

The first conductivity type semiconductor layer 41 may be formed of, for example, a semiconductor material having an empirical formula of $In_xAl_yGa_{1-x-y}N$ (0≤x≤1, 0≤y≤1, 0≤x+y≤1). The first conductivity type semiconductor layer 41 may include, for example, at least one of GaN, AlN, AlGaN, InGaN, InN, InAlGaN, AlInN, AlGaAs, GaP, GaAs, GaAsP, and AlGaInP, and may be an n-type semiconductor layer doped with an n-type dopant such as Si, Ge, Sn, Se, or Te.

The first conductivity type semiconductor layer 41 may be disposed with a single layer or multiple layers. The first conductivity type semiconductor layer 41 may be formed to have a super lattice structure in which at least two different layers are alternately disposed. The first conductivity type semiconductor layer 41 may be an electrode contact layer.

The first clad layer 43 may include AlGaN-based semiconductor. The first clad layer 43 may be an n-type semiconductor layer having a first conductivity type dopant, for example, an n-type dopant. The first clad layer 43 may include at least one of GaN, AlN, AlGaN, InGaN, InN, InAlGaN, AlInN, AlGaAs, GaP, GaAs, GaAsP, and AlGaInP, and may be an n-type semiconductor layer doped with an n-type dopant such as Si, Ge, Sn, Se, or Te.

The first conductivity type semiconductor layer 41 and the first clad layer 43 may be formed of AlGaN-based semiconductor so as to prevent absorption of a UV wavelength.

The active layer 51 may have at least one of a single well structure, a single quantum well (SQM) structure, a multi well structure, a multi quantum well (MQW) structure, a quantum-wire structure, and a quantum dot structure.

The active layer 51 is a layer in which electrons (or holes) injected through the first conductivity type semiconductor layer 41 and holes (or electrons) injected through the second conductivity type semiconductor layer 73 recombine with each other and light is emitted by a band gap difference between energy bands according to a forming material of the active layer 51.

The active layer 51 may be formed of compound semiconductor. The active layer 51 may be formed of at least one of, for example, a group II-VI compound semiconductor and a group III-V compound semiconductor.

When the active layer 51 is formed to have a multi quantum well structure, the active layer 51 includes a plurality of well layers 53 and a plurality of barrier layers 55. In the active layer 51, the well layers 53 and the barrier layers 55 are alternately disposed. A pair of the well layer 53 and the barrier layer 55 may be formed in 2 to 30 cycles.

The well layer 53 may be formed of, for example, a semiconductor material having an empirical formula of $In_xAl_yGa_{1-x-y}N$ ($0 \le x \le 1$, $0 \le y \le 1$, $0 \le x+y \le 1$). The barrier layer 55 may be formed of, for example, a semiconductor material having an empirical formula of $In_xAl_yGa_{1-x-y}N$ ($0 \le x \le 1$, $0 \le y \le 1$, $0 \le x+y \le 1$).

The cycle of the well layer 53/the barrier layer 55 includes, for example, at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the active layer 51 according to an embodiment, the well layer 53 may be formed of AlGaN and the barrier layer 55 may be formed of AlGaN. The active layer 51 may emit a UV wavelength. Aluminum composition of the barrier layer 55 is higher than aluminum composition of the well layer 53. The aluminum composition of the well layer 53 may be in a range of 20% to 40%, and the aluminum composition of the barrier layer 55 may be in a range of 40% to 95%.

The well layer 53 may have a first band gap G1. The barrier layer 55 may have a second band gap G2 that is wider than the first band gap G1 of the well layer 53. The barrier layer 55 may be thicker than the well layer 53.

A thickness of the well layer 53 may be in a range of 3 nm to 5 nm, for example, 2 nm to 4 nm. When the thickness of the well layer 53 is less than the above range, carrier confinement efficiency is reduced, and when the thickness of the well layer 53 is greater than the above range, carriers are excessively confined.

A thickness of the barrier layer 55 may be in a range of 4 nm to 20 nm, for example, 4 nm to 10 nm. When the thickness of the barrier layer 55 is less than the above range, electron blocking efficiency is reduced, and when the thickness of the barrier layer 55 is greater than the above range, electrons are excessively blocked. Carriers can be effectively confined in the well layer 53 according to the thickness of the barrier layer 55, the wavelength of light, and the quantum well structure.

The barrier layer 55 may include a dopant, for example, an n-type dopant. Due to the addition of the n-type dopant, the barrier layer 55 may become an n-type semiconductor layer. When the barrier layer 55 is the n-type semiconductor layer, efficiency of electron injection into the active layer 51 may be increased. A concentration of the n-type dopant added to the barrier layer 55 may be less than $1E20$ $cm^{-3}$. When the concentration of the n-type dopant is greater than $1E20$ $cm^{-3}$, crystallinity of the semiconductor layer may be reduced.

The active layer 51 includes a first barrier layer B1 adjacent to the electron blocking structure layer 60, and includes a first well layer W1 adjacent to the first barrier layer B1 and closer to the first conductivity type semiconductor layer 41 rather than the first barrier layer B1. The first barrier layer B1 is disposed between the first well layer W1 and the electron blocking structure layer 60. The first well layer W1 may be disposed between the first barrier layer B1 and another barrier layer B2.

Figure 2:
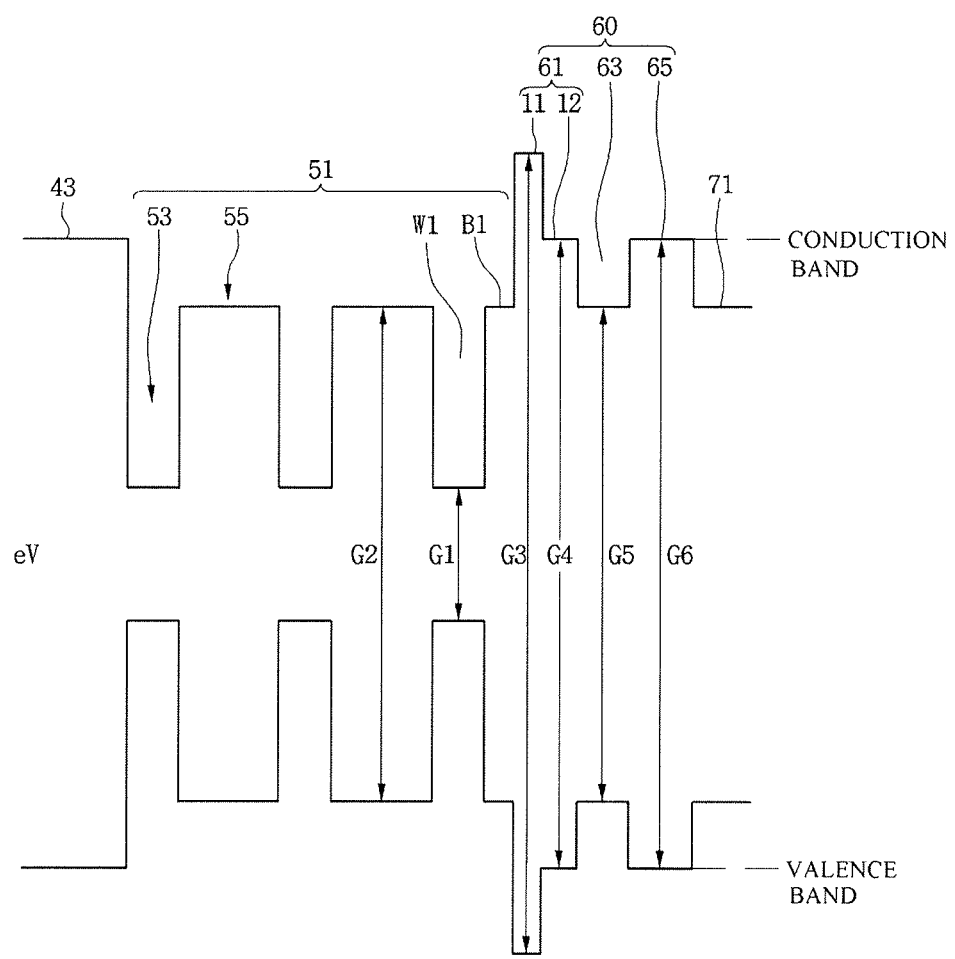
FIG. 2 is a view illustrating an active layer and an electronic blocking structure layer in the light emitting device of FIG. 1, according to a first embodiment.
Figure 3:
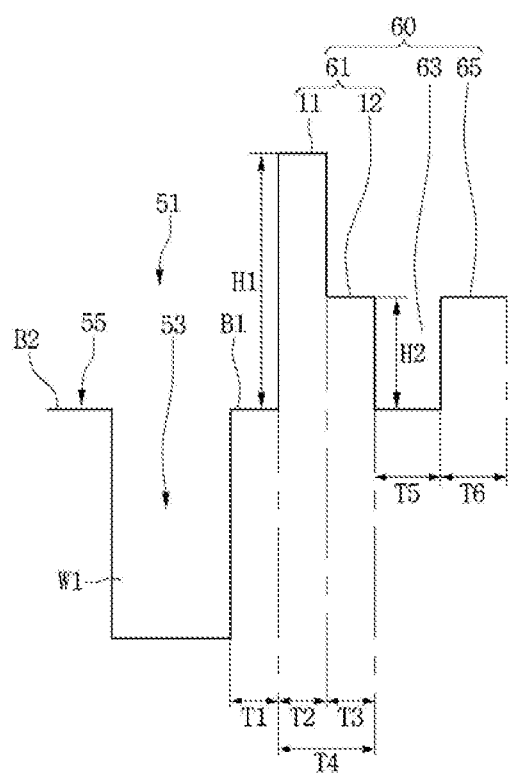
FIG. 3 is a partial enlarged view of the active layer and the electron blocking structure layer of FIG. 2.

As shown in FIGS. 2 and 3, a thickness T1 of the first barrier layer B1 may be less than a thickness of another barrier layer B2. The thickness T1 of the first barrier layer B1 may be less than the thickness of the first well layer W1. The thickness of the first barrier layer B1 may be in a range of 1 nm to 2.5 nm, for example, 1.5 nm to 2.5 nm.

When the thickness T1 of the first barrier layer B1 is greater than the above range, efficiency of hole injection into the first well layer W1 may be reduced, and when the thickness T1 of the first barrier layer B1 is less than the above range, the function as the electron barrier may be deteriorated. A dopant added to another barrier layer B2, for example, an n-type dopant may be added to the first barrier layer B1, and the n-type dopant may be added in a dopant concentration of another barrier layer B2.

Since the n-type dopant is added to the barrier layer B1, injected electrons may be guided, and such electrons may be moved to and confined in the first well layer W1. Since the thickness T1 of the first barrier layer B1 is small, efficiency of hole injection into the first well layer W1 may be improved. Accordingly, the active layer 51 emits a first peak wavelength (P1 in FIG. 10) due to a recombination of electrons and holes injected into the first well layer W1, and the first peak wavelength P1 may be in a range of 270 nm to 290 nm.

When the first barrier layer B1 is an in-type semiconductor and the thickness T1 of the first barrier layer B1 is less than the thickness of the first well layer W1, some of injected electrons may cross over the first barrier layer B1 and move to the electron blocking structure layer 60. In this case, the electron blocking structure layer 60 may emit a second peak wavelength (P2 in FIG. 10) due to a recombination of electrons and holes. The second peak wavelength P2 is shorter than the first peak wavelength P1 and may be in a range of 260 nm to 270 nm. A difference between the first peak wavelength P1 and the second peak wavelength P2 may be 8 nm or more. A light emitting structure having the active layer 51 and the electron blocking structure layer 60 according to an embodiment emits the first and second peak wavelengths P1 and P2 different from each other.

On the other hand, the electron blocking structure layer 60 includes a multi-layered structure. The electron blocking structure layer 60 may include a plurality of semiconductor layers 61, 63, and 65, the plurality of semiconductor layers 61, 63, and 65 may include AlGaN-based semiconductor. The plurality of semiconductor layers 61, 63, and 65 may include a material containing the aluminum composition of 50% or more, or a material having the aluminum composition equal to or higher than the aluminum composition of the barrier layer 155.

The plurality of semiconductor layers 61, 63, and 65 include a first semiconductor layer 61 disposed between the first barrier layer B1 and the first conductivity type semiconductor layer 41, a second semiconductor layer 63 disposed between the first semiconductor layer 61 and the second conductivity type semiconductor layer 73, and a third semiconductor layer 65 disposed between the second semiconductor layer 63 and the second conductivity type semiconductor layer 73. The first to third semiconductor layers 61, 63, and 65 may include AlGaN-based semiconductor.

The first to third semiconductor layers 61, 63, and 65 may include a second conductivity type dopant, for example, a p-type dopant. The first to third semiconductor layers 61, 63, and 65 may have a p-type dopant concentration of 1E17 cm$^3$. When the p-type dopant concentration is low, hole injection efficiency may be reduced.

The first and third semiconductor layers 61 and 63 have barrier structures that block electrons, and the second semiconductor layer 63 has a well structure between the barrier structures in order for hole injection. The aluminum composition of the first and third semiconductor layers 61 and 63 may be higher than the aluminum composition of the second semiconductor layer 63. Band gaps G3 and G4 of the first semiconductor layer 61 and a band gap G6 of the third semiconductor layer 65 may be wider than a band gap G5 of the second semiconductor layer 63. Accordingly, the first to third semiconductor layers 61, 63, and 65 block electrons and guide hole injection.

The first semiconductor layer 61 includes a first region 11 adjacent to the first barrier layer B1 and a second region 12 adjacent to the second semiconductor layer 63. The first region 11 is disposed closer to the first barrier layer B1, the active layer 51, and the first conductivity type semiconductor layer 41 rather than the second region 12 and the second conductivity type semiconductor layer 63. The first region 11 may contact the first barrier layer B1, and the second region 12 may be disposed between the first region 11 and the second semiconductor layer 63 and contact the first region 11 and the second semiconductor layer 63. The second semiconductor layer 63 may be disposed between the first semiconductor layer 61 and the third semiconductor layer 65. The second semiconductor layer 63 may contact the second region 12 of the first semiconductor layer 61 and the third semiconductor layer 65.

In the first semiconductor layer 61, the aluminum composition of the first region 11 may be higher than the aluminum composition of the second region 12. The aluminum composition of the first region 11 may be higher than the aluminum composition of the barrier layer 155 and the third semiconductor layer 65. The second region 12 may have a step structure in which the aluminum composition is reduced stepwise from the first region 11, or a grading structure in which the aluminum composition is reduced linearly.

An average aluminum composition of the first semiconductor layer 61, for example, an average aluminum composition of the first and second regions 11 and 12, may be higher than the aluminum composition of the second semiconductor layer 63 and the third semiconductor layer 65. The aluminum composition of the first region 11 may be 95% or more, for example, 95% to 99.9%. The aluminum composition of the second region 12 may be in a range of 50% to 80%, for example, 70% to 78%. The average aluminum composition of the first semiconductor layer 61 may be 65% or more. When the aluminum composition is less than 65%, holes may not cross over the first semiconductor layer 61. The first region 11 may be a region having the largest barrier difference H1 from the first barrier layer B1, and the second region 12 may be a region having the smallest barrier difference H2 from the first barrier layer B1 or the second semiconductor layer 63.

In the first semiconductor layer 61, the first region 11 includes a semiconductor material having an empirical formula of $Al_aGa_{1-a}N$ ($0.95 \le a < 1$), and the second region 12 includes a semiconductor material having an empirical formula of $Al_bGa_{1-b}N$ ($0.5 \le b < 0.8$, $a>b$). As another example, the first region 11 may be formed of AlN.

As shown in FIG. 3, a thickness T4 of the first semiconductor layer 61 is 7 nm or less, for example, 4.5 nm to 6 nm. The thickness T2 of the first region 11 is in a range of 0.1 nm to 5 nm, for example, 1.5 nm to 2 nm. When the thickness T2 of the first region 11 is less than the above range, it is difficult to perform the light emitting function, and when the thickness T2 of the first region 11 is greater than the above range, holes are excessively blocked and thus an amount of light in the active layer 51 is reduced. The thickness T2 of the first region 11 may be 50% or less of the thickness T4 of the first semiconductor layer 61.

The thickness T3 of the second region 12 may be greater than the thickness T2 of the first region 11. The thickness T3 of the second region 12 may be in a range of 2.5 nm to 5 nm, for example, 2.5 nm to 3.5 nm. When the thickness T3 of the second barrier layer 12 is greater than the above range, hole injection efficiency may be reduced, and when the thickness T3 of the second barrier layer 12 is less than the above range, electrons may overflow.

The aluminum composition of the second semiconductor layer 63 may be in a range of 40% to 65%, and the aluminum composition of the third semiconductor layer 65 may be in a range of 50% to 80%, for example, 70% to 78%. The thickness T5 of the second semiconductor layer 63 may be less than the thickness T4 of the first semiconductor layer 61. For example, the thickness T5 of the second semiconductor layer 63 may be in a range of 4 nm to 6 nm. The thickness T6 of the third semiconductor layer 65 may be less than the thickness T4 of the first semiconductor layer 61. For example, the thickness T6 of the third semiconductor layer 65 may be in a range of 4 nm to 6 nm.

As another example, the second semiconductor layer 63 and the third semiconductor layer 65 may decrease or increase in a grading manner within the above aluminum composition, but are not limited thereto.

In the electron blocking structure layer 60 according to an embodiment, the aluminum composition of the first region 11 adjacent to the active layer 51 is 95% or more. Thus, a light emitting mode between nitrogen vacancy ($V_N^{3+}$) and Mg acceptor, which is a p-type dopant, is generated in the first semiconductor layer 61. That is, in the first region 11 where the aluminum composition is 95% or more, the second peak wavelength is emitted in a range of 4.7 eV (AlN) to 260 nm due to a $V_N^{3+}$-Mg acceptor transition.

Figure 9:
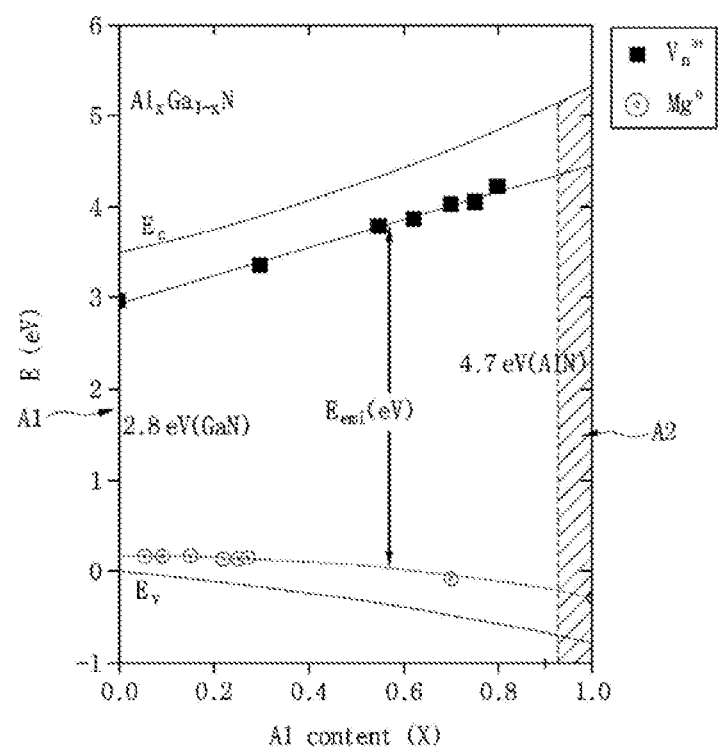
FIG. 9 is a view illustrating a difference in a band gap according to a composition of aluminum according to an embodiment.

As shown in FIG. 9, regarding a band gap according to the aluminum composition, a GaN semiconductor region (A1) has a band gap of 2.8 eV and an MN region has a band gap of 4.7 eV. The region A2 where the aluminum composition is equal to or greater than 0.95 and less than 1 may emit a wavelength of 4.7 eV (AlN) to 260 nm. The first region 11 of the electron blocking structure layer 60 according to the embodiment has a band gap of the region A2 where the aluminum composition is equal to or greater than 95% and less than 100%, the first region 11 emits the second peak wavelength P2 as shown in FIG. 10.

Figure 10:
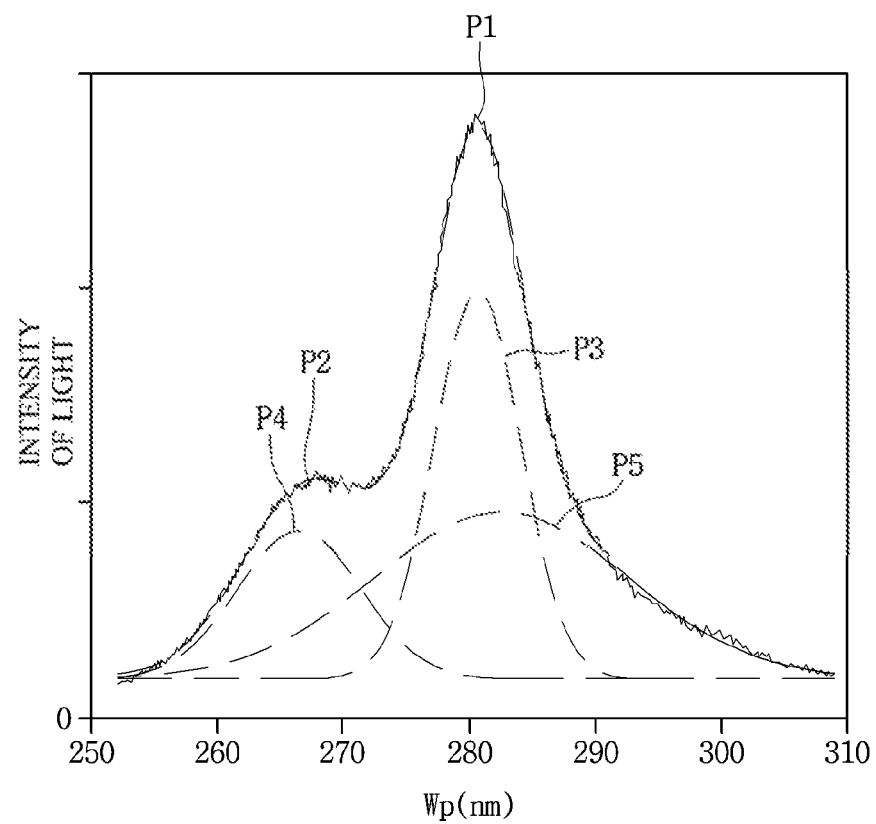
FIG. 10 is a view illustrating peak wavelengths emitted from the light emitting devices according to the first to third embodiments.

Referring to FIGS. 2 and 10, the second peak wavelength P2 may be emitted in a range of 260 nm to 270 nm in the electron blocking structure layer 60, for example, the first semiconductor layer 61. Here, electrons injected into the active layer 51 may cross over the first barrier layer B1 adjacent to the electron blocking structure layer 60 and move to the first semiconductor layer 61, and some of holes supplied to the second conductivity type semiconductor layer 73 may recombine with the electrons in the first region 11 of the first semiconductor layer 61 of the electron blocking structure layer 60. Accordingly, the second peak wavelength P2 shorter than the first peak wavelength P1 may be generated in the first region 11 of the first semiconductor layer 61. A light emitting structure having the active layer 51 and the electron blocking structure layer 60 according to an embodiment emits the first and second peak wavelengths P1 and P2 different from each other.

As shown in FIG. 10, the light emitting device according to an embodiment may emit the first peak wavelength P1 corresponding to a UV wavelength, and the second peak wavelength P2 shorter than the first peak wavelength P1. The first peak wavelength P1 may be in a range of 270 nm to 290 nm, and the second peak wavelength P2 may be in a range of 260 nm to 270 nm. In FIG. 10, wavelengths P3, P4, and P5 indicated by dashed lines are examples in which individual peak wavelengths were measured. A first peak wavelength P1 may be detected by the main and sub wavelengths P3 and P5, and a second peak wavelength may be detected by the main wavelength P4. The main wavelength P3 of the first peak wavelength P1 may have a full width at half maximum (FWHM) of 6 nm or more, the sub wavelength P5 may have an FWHM of 18 nm or more, and the sub wavelength P4 of the second peak wavelength P2 may have an FWHM of 8 nm or more.

Figure 11:
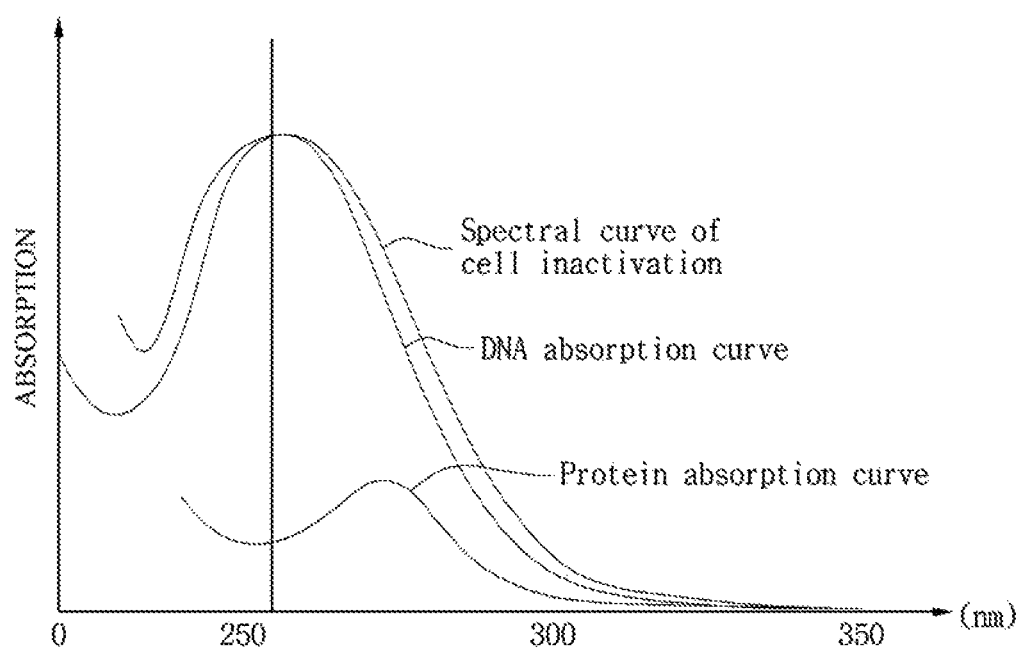
FIG. 11 is a view illustrating an absorption rate of an ultraviolet wavelength according to an embodiment.

As shown in FIGS. 10 and 11, the first peak wavelength P1 emitted from the light emitting device may be provided as a light source for protein absorption wavelength, and the second peak wavelength P2 may be provided as a light source for deoxyribonucleic acid (DNA) absorption wavelength. Since the first peak wavelength P1 and the second peak wavelength P2 are provided at the same time, it is possible to improve sterilizing power in a single UV LED. Additionally, since the single UV LED provides the different peak wavelengths P1 and P2 at the same time, there is an effect that need not mount two light emitting devices, i.e., two LED chips, on a single LED package.

The second clad layer 71 is disposed on the electron blocking structure layer 60. The second clad layer 71 is disposed between the electron blocking structure layer 60 and the second conductivity type semiconductor layer 73.

The second clad layer 71 may include AlGaN-based semiconductor. The second clad layer 71 may be a p-type semiconductor layer having a second conductivity type dopant, for example, a p-type dopant. The second clad layer 71 may include at least one of GaN, AlN, AlGaN, InGaN, InN, InAlGaN, AlInN, AlGaAs, GaP, GaAs, GaAsP, and AlGaInP, and may include a p-type dopant such as Mg, Zn, Ca, Sr, or Ba.

The second conductivity type semiconductor layer 73 may be disposed on the second clad layer 71. The second conductivity type semiconductor layer 73 may be formed of, for example, a semiconductor material having an empirical formula of $In_xAl_yGa_{1-x-y}N$ ($0 \leq x \leq 2$, $0 \leq y \leq 1$, $0 \leq x+y \leq 1$). The second conductivity type semiconductor layer 73 may include, for example, at least one of GaN, MN, AlGaN, InGaN, InN, InAlGaN, AlInN, AlGaAs, GaP, GaAs, GaAsP, and AlGaInP, and may be a p-type semiconductor layer doped with a p-type dopant.

The second conductivity type semiconductor layer 73 may be disposed with a single layer or multiple layers. The second conductivity type semiconductor layer 73 may be formed to have a super lattice structure in which at least two different layers are alternately disposed. The second conductivity type semiconductor layer 73 may be an electrode contact layer. The second conductivity type semiconductor layer 73 and the second clad layer 71 may be formed of AlGaN-based semiconductor so as to prevent absorption of a UV wavelength.

The light emitting structure may include a first conductivity type semiconductor layer 41, an active layer 51, an electron blocking structure layer 61, and a second conductivity type semiconductor layer 73. The light emitting structure may further include first and second clad layers 43 and 71. The light emitting structure of the light emitting device may emit the different first and second peak wavelengths described above. As another example of the light emitting structure, the first conductivity type semiconductor layer 41 and the first clad layer 43 may be implemented by p-type semiconductor layers, and the second clad layer 71 and the second conductivity type semiconductor layer 73 may be implemented by n-type semiconductor layers. The light emitting structure may have any one of an n-p junction structure, a p-n junction structure, an n-p-n junction structure, and a p-n-p junction structure.

Figure 4:
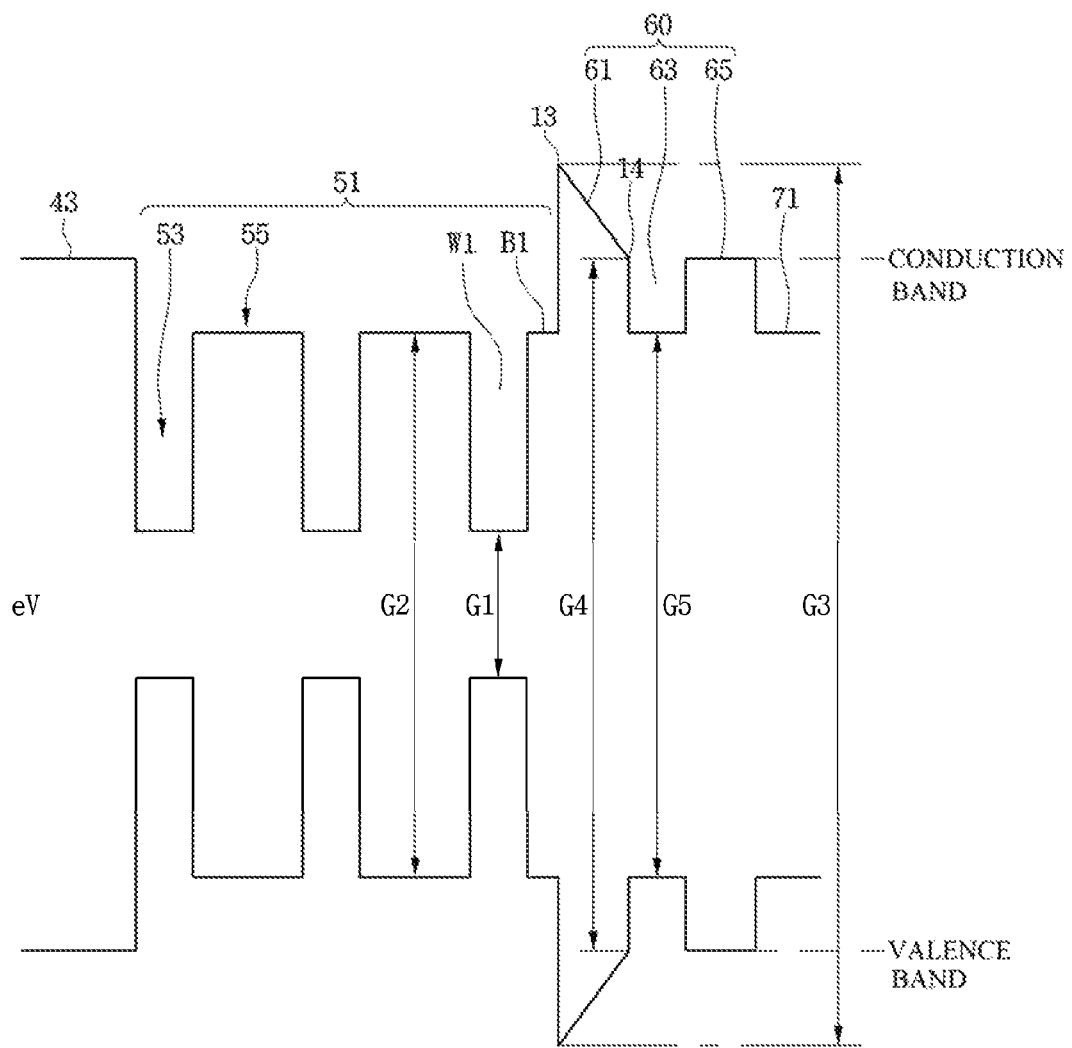
FIG. 4 is a view illustrating an active layer and an electronic blocking structure layer in the light emitting device of FIG. 1, according to a second embodiment.

FIG. 4 is a side cross-sectional view illustrating a light emitting device according to a second embodiment. In describing FIG. 4, the same configuration as that in the first embodiment will be understood by referring to the description of the first embodiment.

Referring to FIGS. 1 and 4, the active layer 51 of the light emitting device is disposed between the first conductivity type semiconductor layer 41 and the second conductivity type semiconductor layer 73. The active layer 51 may be disposed between the first clad layer 43 and the second clad layer 71. The electron blocking layer 60 may be disposed between the active layer 51 and the second conductivity type semiconductor layer 73. The electron blocking layer 60 may be disposed between the active layer 51 and the second clad layer 71.

The light emitting structure may include a first conductivity type semiconductor layer 41, an active layer 51, an electron blocking structure layer 61, and a second conductivity type semiconductor layer 73. The light emitting structure may further include first and second clad layers 43 and 71. The light emitting structure of the light emitting device may emit the different first and second peak wavelengths described above.

The active layer 51 includes a plurality of well layers 53 and a plurality of barrier layers 55. In the active layer 51, the well layers 53 and the barrier layers 55 are alternately disposed. A pair of the well layer 53 and the barrier layer 55 may be formed in 2 to 30 cycles.

The well layer 53 may be formed of, for example, a semiconductor material having an empirical formula of $In_xAlGa_{1-x-y}N$ ($0 \leq x \leq 1$, $0 \leq y \leq 1$, $0 \leq x+y \leq 1$). The barrier layer 55 may be formed of, for example, a semiconductor material having an empirical formula of $In_xAlGa_{1-x-y}N$ ($0 \leq x \leq 1$, $0 \leq y \leq 1$, $0 \leq x+y \leq 1$).

The cycle of the well layer 53/the barrier layer 55 includes, for example, at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the active layer 51 according to an embodiment, the well layer 53 may be formed of AlGaN and the barrier layer 55 may be formed of AlGaN. Aluminum composition of the barrier layer 55 is higher than aluminum composition of the well layer 53. The aluminum composition of the well layer 53 may be in a range of 20% to 40%, and the aluminum composition of the barrier layer 55 may be in a range of 40% to 95%. A difference in aluminum composition between the well layer 53 and the barrier layer 55 may be changed according to the emission wavelength of the active layer 51.

The well layer 53 may have a first band gap G1. The barrier layer 55 may have a second band gap G2 that is wider than the first band gap G1 of the well layer 53. The barrier layer 55 may be thicker than the well layer 53.

The active layer 51 may emit an UV wavelength. A thickness of the well layer 53 may be in a range of 3 nm to 5 nm, for example, 2 nm to 4 nm. When the thickness of the well layer 53 is less than the above range, carrier confinement efficiency is reduced, and when the thickness of the well layer 53 is greater than the above range, carriers are excessively confined.

A thickness of the barrier layer 55 may be in a range of 4 nm to 20 nm, for example, 4 nm to 10 nm. When the thickness of the barrier layer 55 is less than the above range, electron blocking efficiency is reduced, and when the thickness of the barrier layer 55 is greater than the above range, electrons are excessively blocked. Carriers can be effectively confined in the well layer 53 according to the thickness of the barrier layer 55, the wavelength of light, and the quantum well structure.

The barrier layer 55 may include a dopant, for example, an n-type dopant. Due to the addition of the n-type dopant, the barrier layer 55 may become an n-type semiconductor layer. When the barrier layer 55 is the n-type semiconductor layer, guide efficiency of electrons injected into the first conductivity type semiconductor layer 41 may be increased. A concentration of the n-type dopant added to the barrier layer 55 may be less than $1E20\ cm^{-3}$. When the concentration of the n-type dopant is greater than $1E20\ cm^{-3}$, crystallinity of the semiconductor layer may be reduced.

The active layer 51 includes a first barrier layer B1 adjacent to the electron blocking structure layer 60, and includes a first well layer W1 adjacent to the first barrier layer B1 and closer to the first conductivity type semiconductor layer 41 rather than the first barrier layer B1. The first barrier layer B1 is disposed between the first well layer W1 and the electron blocking structure layer 60. The first well layer W1 may be disposed between the first barrier layer B1 and another barrier layer.

The first barrier layer B1 may be thinner than another barrier layer. The first barrier layer B1 may be thinner than the first well layer W1. The thickness of the first barrier layer B1 may be in a range of 1 nm to 2.5 nm, for example, 1.5 nm to 2.5 nm. When the thickness T1 of the first barrier layer B1 is greater than the above range, efficiency of hole injection into the first well layer W1 may be reduced, and when the thickness T1 of the first barrier layer B1 is less than the above range, the function as the barrier may be deteriorated. A dopant added to another barrier layer, for example, an n-type dopant may be added to the first barrier layer B1, and the n-type dopant may be added in a dopant concentration of another barrier layer.

Since the n-type dopant is added to the barrier layer B1, injected electrons may be confined in the first well layer W1. Since the thickness of the first barrier layer B1 is small, efficiency of hole injection into the first well layer W1 may be improved. Accordingly, the active layer 51 emits the first peak wavelength P1 due to a recombination of electrons and holes injected into the first well layer W1. For example, the first peak wavelength may be emitted in a range of 270 nm to 290 nm.

As shown in FIGS. 4 and 10, since the first barrier layer B1 includes an in-type dopant and is thinner than the first well layer W1, injected electrons may cross over the first barrier layer B1 and move to the electron blocking structure layer 60. In this case, the electron blocking structure layer 60 may emit the second peak wavelength P2. The second peak wavelength P2 is shorter than the first peak wavelength P1 and may be in a range of 260 nm to 270 nm. A difference between the first peak wavelength P1 and the second peak wavelength P2 may be 8 nm or more.

The electron blocking structure layer 60 includes AlGaN-based semiconductor and includes a first semiconductor layer 61, a second semiconductor layer 63, and a third semiconductor layer 65. The first to third semiconductor layers 61, 63, and 65 may be formed of AlGaN.

The first semiconductor layer 61 includes a first region 13 having aluminum composition of 95% or more, and a second region 14 having aluminum composition lower than that of the first region 13. The aluminum composition of the first region 13 may be 95% or more, for example, 95% to 99.9%. The aluminum composition of the first region 13 may be gradually reduced in a direction away from the active layer 51 or the first barrier layer B1. The aluminum composition of the second region 14 may be in a range of 50% to 80%, for example, 70% to 78%. In the first semiconductor layer 61, the aluminum composition may be reduced from the first region 13 to the second region 14 in a grading manner.

A band gap G3 of the first region 13 may be wider than a band gap G4 of the second region 14. An average aluminum composition of the first semiconductor layer 61 may be 65% or more, and a thickness of the first semiconductor layer 61 may be 7 nm or less, for example, 4.5 nm to 6 nm. Each of the first to third semiconductor layers 61, 63, and 65 includes an n-type semiconductor layer having a p-type dopant.

Aluminum composition of the second semiconductor layer 63 may be lower than the average aluminum composition of the first semiconductor layer 61. For example, the second semiconductor layer 63 may have aluminum composition of 40% to 65%. Aluminum composition of the third semiconductor layer 65 may be lower than the average aluminum composition of the first semiconductor layer 61. The aluminum composition of the third semiconductor layer 65 may be in a range of 50% to 80%, for example, 70% to 78%. The second semiconductor layer 63 may be thinner than the first semiconductor layer 61. For example, the thickness of the second semiconductor layer 63 may be in a range of 4 nm to 6 nm. The third semiconductor layer 65 may be thinner than the first semiconductor layer 61. For example, the thickness of the third semiconductor layer 65 may be in a range of 4 nm to 6 nm.

In the electron blocking structure layer 60 according to an embodiment, the aluminum composition of the first region 13 adjacent to the active layer 51 is 95% or more. Thus, a light emitting mode between nitrogen vacancy ($V_N^{3+}$) and Mg acceptor, which is a p-type dopant, is generated in the first semiconductor layer 61. That is, in the first region 13 where the aluminum composition is 95% or more, the second peak wavelength P2 is emitted in a range of 4.7 eV (AlN) to 260 nm due to a $V_N^{3+}$-Mg acceptor transition. The second peak wavelength P2 may be emitted in a range of 260 nm to 270 nm in the electron blocking structure layer 60, for example, the first semiconductor layer 61. Here, electrons injected into the active layer 51 may cross over the first barrier layer B1 adjacent to the electron blocking structure layer 60 and move to the first semiconductor layer 61, and some of holes supplied to the second conductivity type semiconductor layer 73 may recombine with the electrons in the first region 13 of the first semiconductor layer 61 of the electron blocking structure layer 60. Accordingly, the second peak wavelength P2 shorter than the first peak wavelength P1 may be emitted in the first region 13 of the first semiconductor layer 61.

Figure 5:
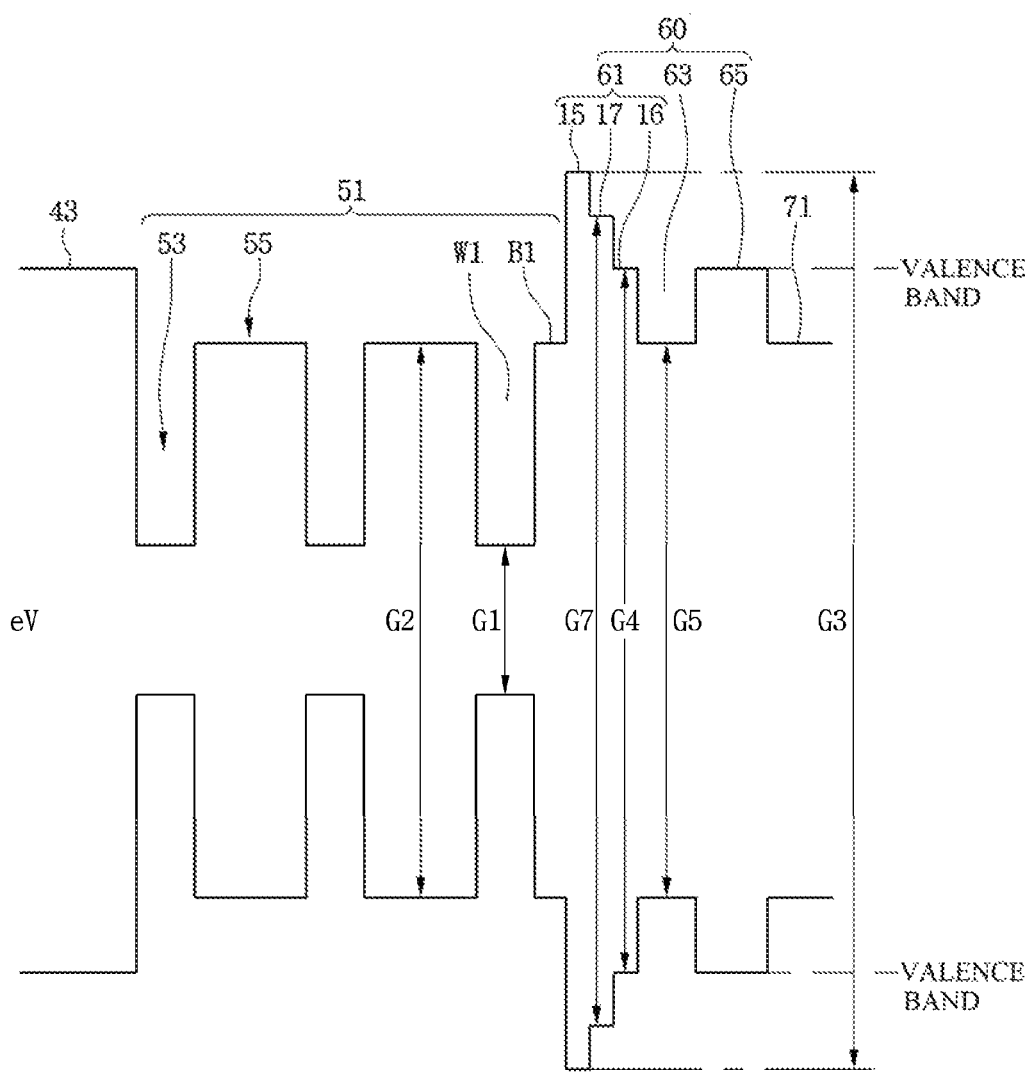
FIG. 5 is a view illustrating an active layer and an electronic blocking structure layer in the light emitting device of FIG. 1, according to a third embodiment.

FIG. 5 is a side cross-sectional view illustrating a light emitting device according to a third embodiment. In describing FIG. 5, the same configuration as those in the first and second embodiments will be understood by referring to the descriptions of the first and second embodiments.

Referring to FIGS. 1 and 5, the active layer 51 of the light emitting device is disposed between the first conductivity type semiconductor layer 41 and the second conductivity type semiconductor layer 73. The active layer 51 may be disposed between the first clad layer 43 and the second clad layer 71. The electron blocking layer 60 may be disposed between the active layer 51 and the second conductivity type semiconductor layer 73. The electron blocking layer 60 may be disposed between the active layer 51 and the second clad layer 71.

The light emitting structure may include a first conductivity type semiconductor layer 41, an active layer 51, an electron blocking structure layer 61, and a second conductivity type semiconductor layer 73. The light emitting structure may further include first and second clad layers 43 and 71. The light emitting structure of the light emitting device may emit the different first and second peak wavelengths described above.

The active layer 51 includes a plurality of well layers 53 and a plurality of barrier layers 55. In the active layer 51, the well layers 53 and the barrier layers 55 are alternately disposed. A pair of the well layer 53 and the barrier layer 55 may be formed in 2 to 30 cycles.

The well layer 53 may be formed of, for example, a semiconductor material having an empirical formula of $In_xAl_yGa_{1-x-y}N$ ($0 \leq x \leq 1$, $0 \leq y \leq 1$, $0 \leq x+y \leq 1$). The barrier layer 55 may be formed of, for example, a semiconductor material having an empirical formula of $In_xAl_yGa_{1-x-y}N$ ($0 \leq x \leq 1$, $0 \leq y \leq 1$, $0 \leq x+y \leq 1$).

The cycle of the well layer 53/the barrier layer 55 includes, for example, at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the active layer 51 according to an embodiment, the well layer 53 may be formed of AlGaN and the barrier layer 55 may be formed of AlGaN. Aluminum composition of the barrier layer 55 is higher than aluminum composition of the well layer 53. The aluminum composition of the well layer 53 may be in a range of 20% to 40%, and the aluminum composition of the barrier layer 55 may be in a range of 40% to 95%.

The well layer 53 may have a first band gap G1. The barrier layer 55 may have a second band gap G2 that is wider than the first band gap G1 of the well layer 53. The barrier layer 55 may be thicker than the well layer 53.

The active layer 51 may emit an UV wavelength. A thickness of the well layer 53 may be in a range of 3 nm to 5 nm, for example, 2 nm to 4 nm. When the thickness of the well layer 53 is less than the above range, carrier confinement efficiency is reduced, and when the thickness of the well layer 53 is greater than the above range, carriers are excessively confined.

A thickness of the barrier layer 55 may be in a range of 4 nm to 20 nm, for example, 4 nm to 10 nm. When the thickness of the barrier layer 55 is less than the above range, electron barrier efficiency is reduced, and when the thickness of the barrier layer 55 is greater than the above range, electrons are excessively blocked. Carriers can be effectively confined in the well layer 53 according to the thickness of the barrier layer 55, the wavelength of light, and the quantum well structure.

The barrier layer 55 may include a dopant, for example, an n-type dopant. Due to the addition of the n-type dopant, the barrier layer 55 may become an n-type semiconductor layer. When the barrier layer 55 is the n-type semiconductor layer, guide efficiency of electrons injected into the first conductivity type semiconductor layer 41 may be increased. A concentration of the n-type dopant added to the barrier layer 55 may be less than $1E20$ $cm^{-3}$. When the concentration of the n-type dopant is greater than $1E20$ $cm^{-3}$, crystallinity of the semiconductor layer may be reduced.

The active layer 51 includes a first barrier layer B1 adjacent to the electron blocking structure layer 60, and includes a first well layer W1 adjacent to the first barrier layer B1 and closer to the first conductivity type semiconductor layer 41 rather than the first barrier layer B1. The first barrier layer B1 is disposed between the first well layer W1 and the electron blocking structure layer 60. The first well layer W1 may be disposed between the first barrier layer B1 and another barrier layer.

The first barrier layer B1 may be thinner than another barrier layer. The first barrier layer B1 may be thinner than the first well layer W1. The thickness of the first barrier layer B1 may be in a range of 1 nm to 2.5 nm, for example, 1.5 nm to 2.5 nm. When the thickness T1 of the first barrier layer B1 is greater than the above range, efficiency of hole injection into the first well layer W1 may be reduced, and when the thickness T1 of the first barrier layer B1 is less than the above range, the function as the barrier may be deteriorated. A dopant added to another barrier layer, for example, an n-type dopant may be added to the first barrier layer B1, and the n-type dopant may be added in a dopant concentration of another barrier layer.

Since the n-type dopant is added to the barrier layer B1, electrons injected into the active layer 51 may be confined in the first well layer W1. Since the thickness of the first barrier layer B1 is small, efficiency of hole injection into the first well layer W1 may be improved. Accordingly, the active layer 51 emits the first peak wavelength P1 due to a recombination of electrons and holes injected into the first well layer W1. For example, the first peak wavelength P1 may be emitted in a range of 270 nm to 290 nm.

Additionally, since the first barrier layer B1 includes an n-type dopant and the thickness of the first barrier layer B1 is less than the thickness of the first well layer W1, some of injected electrons may cross over the first barrier layer B1 and move to the electron blocking structure layer 60. In this case, the electron blocking structure layer 60 may emit the second peak wavelength P2. The second peak wavelength P2 is shorter than the first peak wavelength P1 and may be in a range of 260 nm to 270 nm. A difference between the first peak wavelength P1 and the second peak wavelength P2 may be 8 nm or more.

The electron blocking structure layer 60 includes AlGaN-based semiconductor and includes a first semiconductor layer 61, a second semiconductor layer 63, and a third semiconductor layer 65. The first to third semiconductor layers 61, 63, and 65 may be formed of AlGaN.

The first semiconductor layer 61 includes a first region 15 having aluminum composition of 95% or more, a second region 16 having aluminum composition lower than that of the first region 15, and a third region 17 disposed between the first region 15 and the second region 116 and having aluminum composition lower than that of the first region 15 and higher than that of the second region 16.

In the first semiconductor layer 61, the first region 15 and the third region 17 may be disposed in a step structure or a grading structure, and the third region 17 and the second region 16 may be disposed in a step structure or a grading structure. The third region 17 may be connected to the first region 15 in a step structure and connected to the second region 16 in a step structure, may be connected to the first region 15 in a step structure and connected to the second region 16 in a grading structure, or may be connected to the first region 15 in a grading structure and connected to the second region 16 in a step structure.

A band gap G3 of the first region 15 may be wider than band gaps G4 and G7 of the second and third regions 16 and 17. An average aluminum composition of the first semiconductor layer 61 may be 65% or more, and a thickness of the first semiconductor layer 61 may be 7 nm or less, for example, 4.5 nm to 6 nm. When the aluminum composition of the first semiconductor layer 61 is less than 65%, holes may not cross over the first semiconductor layer 61.

The aluminum composition of the first region 15 may be 95% or more, for example, 95% to 99.9%. The aluminum composition of the second region 16 may be in a range of 50% to 80%, for example, 70% to 78%. The aluminum composition of the third region 17 may be between the aluminum composition of the first region 15 and the aluminum composition of the second region 16 or may be the average aluminum composition of the first semiconductor layer 61. The first region 15 may be a region having the largest barrier difference from the first barrier layer B1, and the second region 16 may be a region having the smallest barrier difference from the first barrier layer B1 or the second semiconductor layer 63.

A thickness of the first semiconductor layer 61 is 7 nm or less, for example, 4.5 nm to 6 nm. The thickness of the first region 15 is in a range of 0.1 nm to 5 nm, for example, 1.5 nm to 2 nm. When the thickness of the first region 15 is less than the above range, it is difficult to perform the light emitting function, and when the thickness of the first region 15 is greater than the above range, holes are excessively increased and thus it is difficult to emit light.

The sum of the thicknesses of the second and third regions 16 and 17 may be greater than the thickness of the first region 15 and may be in a range of 2.5 nm to 5 nm, for example, 2.5 nm to 3.5 nm. The thickness of each of the second and third regions 16 and 17 may be equal to the thickness of the first region 15, or may be in a range of 1.5 nm to 2 nm. When the thickness of each of the regions 15, 16, and 17 is greater than the above range, hole injection efficiency may be reduced, and when the thickness of each of the regions 15, 16, and 17 is less than the above range, electrons may overflow.

The aluminum composition of the second semiconductor layer 63 may be in a range of 40% to 65%, and the aluminum composition of the third semiconductor layer 65 may be in a range of 50% to 80%, for example, 70% to 78%. The second semiconductor layer 63 may be thinner than the first semiconductor layer 61. For example, the thickness of the second semiconductor layer 63 may be in a range of 4 nm to 6 nm. The third semiconductor layer 65 may be thinner than the first semiconductor layer 61. For example, the thickness of the third semiconductor layer 65 may be in a range of 4 nm to 6 nm.

In the electron blocking structure layer 60 according to an embodiment, the aluminum composition of the first region 15 adjacent to the active layer 51 is 95% or more. Thus, a light emitting mode between nitrogen vacancy ($V_N^{3+}$) and Mg acceptor, which is a p-type dopant, is generated in the first semiconductor layer 61. That is, in the first region 11 where the aluminum composition is 95% or more, the second peak wavelength P2 is emitted in a range of 4.7 eV (AlN) to 260 nm due to a $V_N^{3+}$-Mg acceptor transition. The second peak wavelength P2 may be emitted in a range of 260 nm to 270 nm in the electron blocking structure layer 60, for example, the first semiconductor layer 61. Here, electrons injected into the active layer 51 may cross over the first barrier layer B1 adjacent to the electron blocking structure layer 60 and move to the first semiconductor layer 61, and some of holes supplied through the second conductivity type semiconductor layer 73 may recombine with the electrons in the first region 15 of the first semiconductor layer 61 of the electron blocking structure layer 60. Accordingly, the second peak wavelength P2 shorter than the first peak wavelength P1 may be emitted in the first region 15 of the first semiconductor layer 61.

Figure 6:
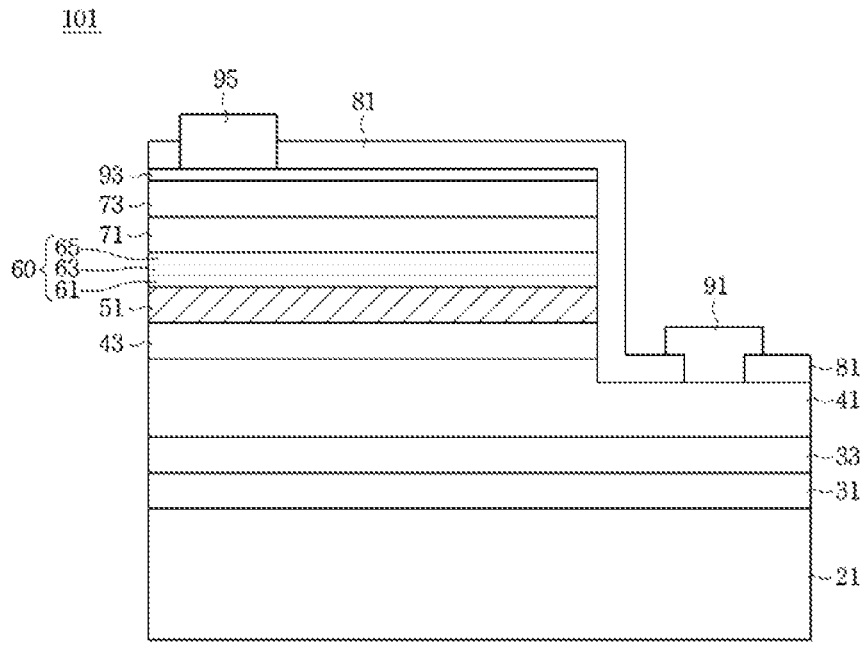
FIG. 6 illustrates an example in which an electrode is disposed in the light emitting device of FIG. 1.

FIG. 6 illustrates an example in which an electrode is disposed in the light emitting device of FIG. 1. In describing FIG. 6, the same configuration as that disclosed above will be understood by referring to the descriptions of the above embodiments.

Referring to FIG. 6, the light emitting device 101 includes a first electrode 91 and a second electrode 95. The first electrode 91 may be electrically connected to the first conductivity type semiconductor layer 41, and the second electrode 95 may be electrically connected to the second conductivity type semiconductor layer 73. The first electrode 91 may be disposed on the first conductivity type semiconductor layer 41, and the second electrode 95 may be disposed on the second conductivity type semiconductor layer 73.

At least one or all of the first electrode 91 and the second electrode 95 may further include a current diffusion pattern having an arm structure or a finger structure. The first electrode 91 and the second electrode 95 may be formed of a non-light-transmitting metal having characteristics of ohmic contact, a contact layer, and a bonding layer, but are not limited thereto. The first electrode 93 and the second electrode 95 may be selected from Ti, Ru, Rh, Ir, Mg, Zn, Al, In, Ta, Pd, Co, Ni, Si, Ge, Ag, Au, and selective alloys thereof.

An electrode layer 93 may be disposed between the second electrode 95 and the second conductivity type semiconductor layer 73. The electrode layer 93 may be formed of a light-transmitting material transmitting light of 70% or more, or a material having reflective characteristics reflecting light of 70% or more. For example, the electrode layer 93 may be formed of a metal or a metal oxide. The electrode layer 93 may be selectively formed of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ZnO, $IrO_x$, $RuO_x$, NiO, Al, Ag, Pd, Rh, Pt, or Ir.

An insulating film 81 may be disposed on the electrode layer 93. The insulating layer 81 may be disposed on an upper surface of the electrode layer 93 and a side surface of the semiconductor layer and may selectively contact the first and second electrodes 91 and 95. The insulating layer 81 includes an insulating material or an insulating resin formed of at least one of oxide, nitride, fluoride, and sulfide including at least one of Al, Cr, Si, Ti, Zn, and Zr. The insulating layer 81 may be selectively formed of, for example, $SiO_2$, $Si_3N_4$, $Al_2O_3$, or $TiO_2$. The insulating layer 81 may be formed with a single layer or multiple layers, but is not limited thereto. The insulating layer 81 may not be formed.

As shown in FIG. 10, the light emitting device 101 according to an embodiment may emit the first peak wavelength P1 corresponding to a UV wavelength, and the second peak wavelength P2 shorter than the first peak wavelength P1. The first peak wavelength P1 may be in a range of 270 nm to 290 nm, and the second peak wavelength P2 may be in a range of 260 nm to 270 nm.

As shown in FIGS. 10 and 11, the first peak wavelength P1 emitted from the light emitting device 101 may be provided as a light source for protein absorption wavelength, and the second peak wavelength P2 may be provided as a light source for DNA absorption wavelength. By providing the first peak wavelength P1 and the second peak wavelength P2 together, it is possible to improve sterilizing power in a single UV LED. Additionally, since the different peak wavelengths P1 and P2 are provided at the same time, there is an effect that need not mount two light emitting devices on a single package.

Figure 7:
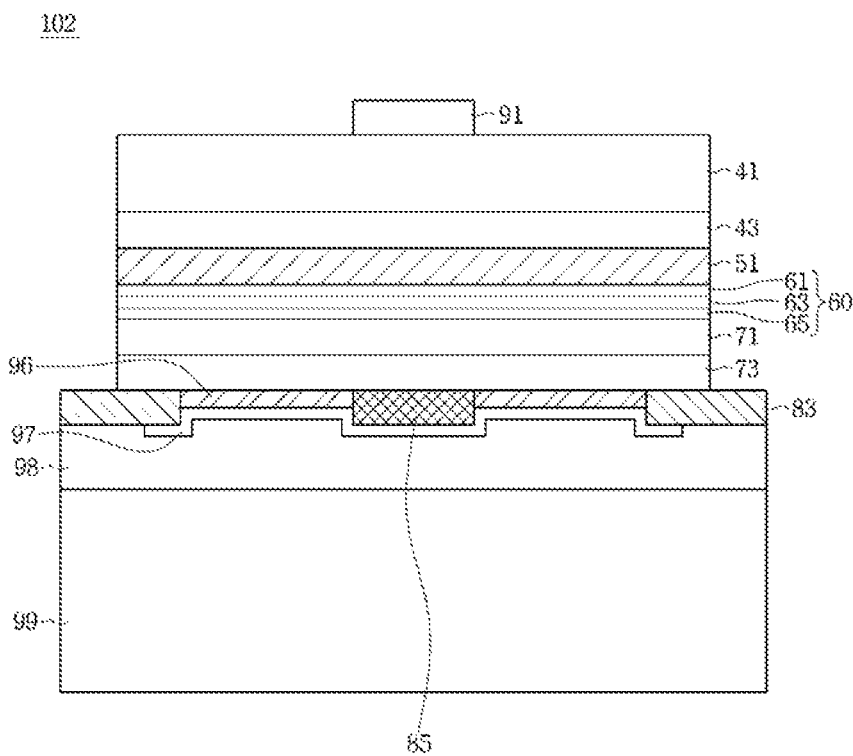
FIG. 7 illustrates another example in which an electrode is disposed in the light emitting device of FIG. 1.

FIG. 7 is a view illustrating an example of a vertical light emitting device using the light emitting device having the electron blocking structure layer of FIG. 1. In describing FIG. 7, the same configuration as that disclosed above will be understood by referring to the descriptions of the above embodiments.

Referring to FIG. 7, the light emitting device 102 includes a first electrode 91 on a first conductivity type semiconductor layer 41, and a second electrode including a plurality of conductive layers 96, 97, 98, and 99 below the second conductivity type semiconductor layer 73.

The second electrode may be disposed below the second conductivity type semiconductor layer 73 and may include a contact layer 96, a reflection layer 97, a bonding layer 98, and a support member 99. The contact layer 96 contacts the semiconductor layer, for example, the second conductivity type semiconductor layer 73. The contact layer 96 may be formed of a low-conductivity material such as ITO, IZO, IZTO, IAZO, IGZO, IGTO, AZO, or ATO, or a metal such as Ni or Ag, and may be formed with a single layer or multiple layers. The reflection layer 97 may be disposed below the contact layer 96, and the reflection layer 97 may be formed in a structure including at least one layer formed of a material selected from the group consisting of Ag, Ni, Al, Rh, Pd, Ir, Ru, Mg, Zn, Pt, Au, Hf, and any combination thereof. The reflection layer 97 may contact a lower portion of the second conductivity type semiconductor layer 73, but is not limited thereto.

The bonding layer 98 may be disposed below the reflection layer 97, and the bonding layer 98 may be used as a barrier metal or a bonding metal. The material may include, for example, at least one of Ti, Au, Sn, Ni, Cr, Ga, In, Bi, Cu, Ag, Ta, and selective alloys thereof.

A channel layer 83 and a current blocking layer 85 may be disposed between the second conductivity type semiconductor layer 73 and the second electrode.

The channel layer 83 may be formed along a lower edge of the second conductivity type semiconductor layer 73 and may be formed to have a ring shape, a loop shape, or a frame shape. The channel layer 83 may include a transparent conductive material or an insulating material. For example, the channel layer 83 may include at least one of ITO, IZO, IZTO, IAZO, IGZO, IGTO, AZO, ATO, $SiO_2$, $SiO_x$, $SiO_xN_y$, $Al_2O_3$, and $TiO_2$. An inner part of the channel layer 83 is disposed below the second conductivity type semiconductor layer 73, and an outer part of the channel layer 83 is disposed on an outer side rather than the side surface of the light emitting structure.

The current blocking layer 85 may be disposed between the second conductivity type semiconductor layer 73 and the contact layer 96 or the reflection layer 97. The current blocking layer 85 may include an insulating material. For example, the current blocking layer 85 may include at least one of $SiO_2$, $SiO_x$, $SiO_xN_y$, $Si_3N_4$, $Al_2O_3$, and $TiO_2$. As another example, the current blocking layer 85 may be formed of a metal for Schottky contact.

The current blocking layer 85 is disposed corresponding to the first electrode 91 disposed on the light emitting structure in a thickness direction of the light emitting device. The current blocking layer 161 may block current supplied from the second electrode 170 to thereby spread the current toward another path. One or more current blocking layers 85 may be disposed, and a partial or entire region thereof may be overlapped in a direction perpendicular to the first electrode 91.

A support member is disposed below the bonding layer 98. The support member 99 may be formed of a conductive member. The support member 99 may be formed of a conductive material such as copper (Cu), gold (Au), nickel (Ni), molybdenum (Mo), copper-tungsten (Cu—W), carrier wafer (for example, Si, Ge, GaAs, ZnO, SiC, or the like). As another example, the support member 99 may be implemented by a conductive sheet.

Here, the substrate of FIG. 1 is removed. The growth substrate may be removed by a physical method (for example, laser lift off) and/or a chemical method (wet etching or the like), and the first conductivity type semiconductor layer 41 is exposed. A first electrode 91 is formed on the first conductivity type semiconductor layer 41 by performing an isolation etching through a direction in which the substrate is removed.

A light extraction structure (not shown) such as roughness may be formed on the upper surface of the first conductivity type semiconductor layer 41. An insulating layer (not shown) may be further disposed on the surface of the semiconductor layer, but is not limited thereto. Accordingly, a light emitting device 102 can be manufactured which has a vertical electrode structure including the first electrode 91 on the light emitting structure and the support member 99 below the light emitting structure.

As shown in FIG. 10, the light emitting device 101 according to an embodiment may emit the first peak wavelength P1 corresponding to a UV wavelength, and the second peak wavelength P2 shorter than the first peak wavelength P1. The first peak wavelength P1 may be in a range of 270 nm to 290 nm, and the second peak wavelength P2 may be in a range of 260 nm to 270 nm.

As shown in FIGS. 10 and 11, the first peak wavelength P1 emitted from the light emitting device 101 may be provided as a light source for protein absorption wavelength, and the second peak wavelength P2 may be provided as a light source for DNA absorption wavelength. By providing the first peak wavelength P1 and the second peak wavelength P2 together, it is possible to improve sterilizing power in a single UV LED. Additionally, since the different peak wavelengths P1 and P2 are provided at the same time, there is an effect that need not mount two light emitting devices on a single package.

<Light Emitting Device Package>

Figure 8:
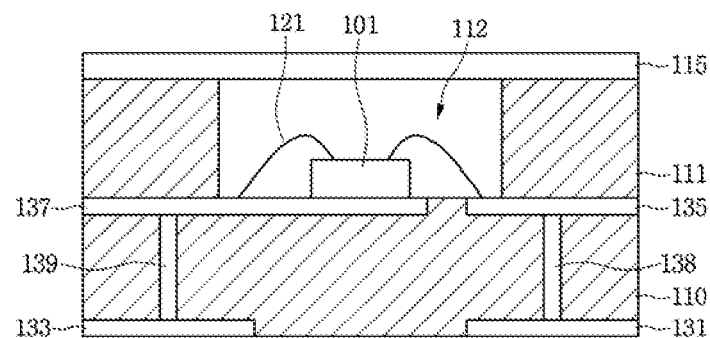
FIG. 8 is a view illustrating a light emitting device package including the light emitting device of FIG. 6.

FIG. 8 is a view illustrating a light emitting device package including the light emitting device of FIG. 6.

Referring to FIG. 8, the light emitting device package includes a support member 110, a reflection member 111 having a cavity 112 on the support member 110, a light emitting chip 101 disposed on the support member 110 and disposed inside the cavity 112, and a light-transmitting film 115 on the cavity 112.

The support member 110 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), liquid crystal polymer, and a metal core PCB (MCPCB) having a metal layer on a bottom, but is not limited to these materials.

The support member 110 may include a first metal layer 131, a second metal layer 133, a first connection member 138, a second connection member 139, a first electrode layer 135, and a second electrode layer 137. The first metal layer 131 and the second metal layer 133 are disposed spaced apart from each other on the bottom of the support member 110. The first electrode layer 135 and the second electrode layer 137 are disposed spaced apart from each other on the upper surface of the support member 110. The first connection member 138 may be disposed inside the support member 110 or on a first side surface of the support member 110. The first connection member 138 connects the first metal layer 131 to the first electrode layer 135. The second connection member 139 may be disposed inside the support member 110 or on a second side surface of the support member 110. The second connection member 139 connects the second metal layer 133 to the second electrode layer 137.

The first metal layer 131, the second metal layer 133, the first electrode layer 135, and the second electrode layer 137 may be formed of a metal material, for example, at least one selected from titanium (Ti), copper (Cu), nickel (Ni), gold (Au), chromium (Cr), tantalum (Ta), platinum (Pt), tin (Sn), silver (Ag), and phosphorus (P), or selective alloys thereof, and may be formed with a single metal layer or multiple metal layers.

Each of the first connection member 138 and the second connection member 139 may include at least one of a via, a via hole, and a through-hole.

The reflection member 111 is disposed around the cavity 112 on the support member 110 and may reflect UV light emitted from the light emitting device 101.

The reflection member 111 may be formed of at least one of a resin-based printed circuit board (PCB), a silicon-based material such as silicon or silicon carbide (SiC), a ceramic-based material such as aluminum nitride (AlN), a resin-based material such as polyphthalamide (PPA), and liquid crystal polymer, but is not limited to these materials. The support member 110 and the reflection member 111 may include ceramic-based materials, and these ceramic-based materials have higher heat dissipation efficiency than that of the resin material.

The light emitting device 101 may be disposed on the second electrode layer 137 or may be disposed on the support member 119. The light emitting device 101 may be electrically connected to the first electrode layer 135 and the second electrode layer 137. The light emitting device 101 may be connected to the first electrode layer 135 by a wire 121. As another example, the light emitting device 101 may be bonded on the first and second electrode layers 135 and 137 in a flip chip manner.

As shown in FIG. 10, the light emitting device 101 may emit the first peak wavelength P1 corresponding to a UV wavelength, and the second peak wavelength P2 shorter than the first peak wavelength P1. The first peak wavelength P1 may be in a range of 270 nm to 290 nm, and the second peak wavelength P2 may be in a range of 260 nm to 270 nm.

The light-transmitting film 115 is disposed on the cavity 112 and emits a dual peak wavelength emitted from the light emitting device 101. The light-transmitting film 115 may include a glass material, a ceramic material, or a light-transmitting resin material.

Additionally, an optical lens or a phosphor layer may be further disposed on the cavity 112, but the present invention is not limited thereto.

The light emitting device or the light emitting device package according to embodiments may be applied to a light unit. The light unit is an assembly including one or more light emitting devices or a light emitting device package.

The features, structures, and effects described above are included in at least one embodiment and are not necessarily limited to only one embodiment. Furthermore, the features, structures, and effects described in each embodiment can be carried out through combinations or modifications in other embodiments by those skilled in the art to which the embodiments pertain.

Although embodiments have been particularly shown and described, they are only for illustrative purposes and are not intended to the present invention. It will be understood that various modifications and applications can be made thereto without departing from the scope of the present invention by those skilled in the art to which the embodiments pertain. For example, the elements particularly shown in the embodiments can be carried out through modifications. It will be understood that differences related to these modifications and applications fall within the scope of the embodiments defined by the appended claims.

INDUSTRIAL APPLICABILITY

An embodiment may be used as a UV LED, which emits a dual peak wavelength in a single LED chip.

An embodiment may be applied to a sterilization UV lamp by using a dual peak wavelength.

An embodiment may be applied to a light emitting device, which emits a dual peak wavelength, and a light emitting device package including the same.

A light emitting device, which emits a dual peak wavelength, and a light emitting device package including the same according to embodiments may be applied to a light unit.

The invention claimed is:

1. A light emitting device comprising:
    a first conductivity type semiconductor layer comprising a first conductivity type dopant;
    an active layer disposed on the first conductivity type semiconductor layer and comprising a plurality of barrier layers and a plurality of well layers;
    an electron blocking structure layer disposed on the active layer;
    a second conductivity type semiconductor layer disposed on the electron blocking structure layer and comprising a second conductivity type dopant;
    a first electrode electrically connected to the first conductivity type semiconductor layer; and
    a second electrode electrically connected to the second conductivity type semiconductor layer,
    wherein the active layer comprises a first barrier layer adjacent to the electron blocking structure layer and a first well layer adjacent to the first barrier layer,
    the plurality of barrier layers comprise a first conductivity type dopant, the electron blocking structure layer comprises a plurality of semiconductor layers, wherein the plurality of semiconductor layers include a second conductivity type dopant and AlGaN-based semiconductor, the plurality of semiconductor layers comprise a first semiconductor layer having a first region adjacent to the first barrier layer, the first region of the first semiconductor layer comprises AlGaN-based semiconductor having aluminum composition of 95% or more, a light emitting structure comprising the active layer and the electron blocking structure layer emits different peak wavelengths, and the electron blocking structure layer is disposed between the active layer and the second conductivity type semiconductor layer, wherein the first barrier layer is disposed between the first semiconductor layer and the first well layer, wherein a thickness of the first barrier layer is smaller than a thickness of the first well layer and is smaller than a thickness of another barrier layer within the plurality of barrier layers, wherein the first well layer has a first band gap, wherein the first barrier layer has a second band gap greater than the first band gap, and wherein band gaps of at least two of the plurality of semiconductor layers within the electron blocking structure layer are greater than the second band gap.

2. The light emitting device according to claim 1, wherein the first conductivity type dopant comprises an n-type dopant, the second conductivity type dopant comprises a p-type dopant, wherein the different peak wavelengths include an ultraviolet light, wherein the active layer emits a first peak wavelength, and wherein the first peak wavelength is a shorter wavelength within the different peak wavelengths.

3. The light emitting device according to claim 2, wherein the plurality of semiconductor layers comprise a second semiconductor layer disposed between the first semiconductor layer and the second conductivity type semiconductor layer, and a third semiconductor layer disposed between the second semiconductor layer and the second conductivity type semiconductor layer, and wherein aluminum composition of the second semiconductor layer is lower than aluminum composition of the first and third semiconductor layers.

4. The light emitting device according to claim 3, wherein the first semiconductor layer comprises a second region disposed between the first region and the second semiconductor layer, the second region comprises AlGaN-based semiconductor, of which aluminum composition is lower than aluminum composition of the first region, wherein the second semiconductor layer is formed in a well structure between the first and third semiconductor layer, wherein the first region of the first semiconductor layer has a third band gap greater than the second band gap, and wherein the second region of the first semiconductor layer has a fourth band gap smaller than the third band gap.

5. The light emitting device according to claim 4, wherein the aluminum composition of the AlGaN-based semiconductor in the second region is reduced linearly or stepwise from aluminum composition of AlGaN-based semiconductor in the first region.

6. The light emitting device according to claim 4, wherein a thickness of the second region is greater than a thickness of the first region.

7. The light emitting device according to claim 4, further comprising a third region disposed between the first region and the second region, wherein aluminum composition of the third region is lower than aluminum composition of the first region and higher than aluminum composition of the second region.

8. The light emitting device according to claim 3, wherein the second semiconductor layer directly contacts the first semiconductor layer and the third semiconductor layer in a well structure, and wherein the second semiconductor layer has a fifth band gap greater than the first band gap and smaller than a band gap of the first semiconductor layer.

9. The light emitting device according to claim 1, wherein a thickness of the first region is less than the thickness of the first well layer or is 50% or less of a thickness of the first semiconductor layer.

10. The light emitting device according to claim 1, wherein the well layer comprises AlGaN, and the barrier layer comprises AlGaN, of which aluminum composition is higher than aluminum composition of the well layer.

11. The light emitting device according to claim 9, wherein the first region of the first semiconductor layer has the widest band gap in the electron blocking structure layer and directly contacts the first barrier layer, wherein average aluminum composition of the first semiconductor layer is 65% or more, and wherein the thickness of the first semiconductor layer is in a range of 4.5 nm to 6 nm.

12. The light emitting device according to claim 4, wherein average aluminum composition of the first semiconductor layer is 65% or more, and wherein the aluminum composition of the second region is in a range of 50% to 80%.

13. The light emitting device according to claim 4, wherein aluminum composition of the first semiconductor layer is gradually reduced in a direction far away from the active layer.

14. The light emitting device according to claim 4, wherein the active layer emits the first peak wavelength in a range of 270 nm to 290 nm, wherein the electron blocking structure layer emits a second peak wavelength shorter than the first peak wavelength, wherein the well layer includes an AlGaN, wherein the barrier layer has an AlGaN which is a higher aluminum composition than an aluminum composition of the well layer.

15. The light emitting device according to claim 14, wherein the second peak wavelength is in a range of 260 nm to 270 nm.

16. The light emitting device according to claim 14, wherein the second peak wavelength is shorter than the first peak wavelength and has a difference from the first peak wavelength by 8 nm or more.

17. The light emitting device according to claim 1, further comprising a clad layer between the electron blocking structure layer and the second conductivity type semiconductor layer, wherein each of the electron blocking structure layer, the second conductivity type semiconductor layer, and the clad layer comprise a p-type semiconductor layer.

18. A light emitting device package comprising:

a support member;

a light emitting device disposed on the support member; and first and second electrode layers electrically connected to the light emitting device, wherein a light emitting structure of the light emitting device emits ultraviolet light having different first and second peak wavelengths, wherein the light emitting device includes:

a first conductivity type semiconductor layer comprising a first conductivity type dopant and electrically connected to the first electrode layer;

an active layer disposed on the first conductivity type semiconductor layer and comprising a plurality of barrier layers and a plurality of well layers;

an electron blocking structure layer disposed on the active layer; and a second conductivity type semiconductor layer disposed on the electron blocking structure layer and electrically connected to the second electrode layer, wherein the active layer comprises a first barrier layer adjacent to the electron blocking structure layer and a first well layer adjacent to the first barrier layer, the plurality of barrier layers comprise a first conductivity type dopant, the electron blocking structure layer comprises a plurality of semiconductor layers, wherein the plurality of semiconductor layers include a second conductivity type dopant and AlGaN-based semiconductor, the plurality of semiconductor layers comprise a first semiconductor layer having a first region adjacent to the first barrier layer, the first region of the first semiconductor layer comprises AlGaN-based semiconductor having aluminum composition of 95% or more, a light emitting structure comprising the active layer and the electron blocking structure layer emits different ultraviolet light, wherein the first barrier layer is disposed between the first semiconductor layer and the first well layer, wherein a thickness of the first barrier layer is smaller than a thickness of the first well layer and smaller than a thickness of another barrier layer within the plurality of barrier layers, wherein the first well layer has a first band gap, wherein the first barrier layer has a second band gap greater than the first band gap, and wherein band gaps of at least two of the plurality of semiconductor layers within the electron blocking structure layer are greater than the second band gap.

19. The light emitting device package according to claim 18, wherein the active layer and the electron blocking structure layer of the light emitting structure emit the first peak wavelength in a range of 270 nm to 290 nm, wherein the electron blocking structure layer comprises a second semiconductor layer disposed between the first semiconductor layer and the second conductivity type semiconductor layer, and a third semiconductor layer disposed between the second semiconductor layer and the second conductivity type semiconductor layer, and wherein the first semiconductor layer has a second region between the first region and the second semiconductor layer, wherein aluminum composition of the second semiconductor layer is lower than aluminum composition of the first and third semiconductor layers, wherein the first region of the first semiconductor layer has a third band gap greater than the second band gap, wherein the second region of the first semiconductor layer has a fourth band gap smaller than the third band gap, wherein the second semiconductor layer has a fifth band gap smaller than the fourth band gap and greater than the first band gap, and wherein the third semiconductor layer has a sixth band gap greater than the fifth band gap.

20. The light emitting device package according to claim 19, wherein the electron blocking layer structure layer emits a second wavelength, wherein the second wavelength is shorter than the first wavelength, wherein the second peak wavelength is in a range of 260 nm to 270 nm, and has a difference from the first peak wavelength by 8 nm or more, wherein the well layer includes an AlGaN layer, wherein the barrier layer has an AlGaN layer which is a higher aluminum composition than an aluminum composition of the well layer, the second region comprises AlGaN-based semiconductor, of which aluminum composition is lower than aluminum composition of the first region.

* * * * *